United States Patent
Höhn et al.

(10) Patent No.: US 7,235,189 B2
(45) Date of Patent: *Jun. 26, 2007

(54) METHOD OF PRODUCING A WAVELENGTH-CONVERTING CASTING COMPOSITION

(75) Inventors: Klaus Höhn, Taufkirchen (DE); Alexandra Debray, Regensburg (DE); Peter Schlotter, Freiburg (DE); Ralf Schmidt, Vörstetten (DE); Jürgen Schneider, Kirchzarten (DE)

(73) Assignee: Osram GmbH (DE)

( * ) Notice: Subject to any disclaimer, the term of this patent is extended or adjusted under 35 U.S.C. 154(b) by 5 days.

This patent is subject to a terminal disclaimer.

(21) Appl. No.: 09/731,406

(22) Filed: Dec. 6, 2000

(65) Prior Publication Data

US 2001/0045647 A1    Nov. 29, 2001

Related U.S. Application Data

(60) Division of application No. 09/536,564, filed on Mar. 28, 2000, now Pat. No. 6,277,301, which is a division of application No. 09/082,205, filed on May 20, 1998, now Pat. No. 6,066,861, which is a continuation of application No. PCT/DE97/02139, filed on Sep. 22, 1997.

(30) Foreign Application Priority Data

Sep. 20, 1996    (DE)    ................ 196 38 667

(51) Int. Cl.
    C09K 11/02    (2006.01)
(52) U.S. Cl. .................... 252/301.36; 252/301.4 R
(58) Field of Classification Search ........... 252/301.36, 252/301.4 R
    See application file for complete search history.

(56) References Cited

U.S. PATENT DOCUMENTS

| | | | |
|---|---|---|---|
| 2,096,693 A | 10/1937 | Cox | |
| 2,192,869 A | 3/1940 | Pearce | |
| 3,312,851 A | 4/1967 | Flowers et al. | |
| 3,316,109 A | 4/1967 | Rimbach | |
| 3,440,471 A | 4/1969 | Baczewski et al. | |
| 3,453,604 A | 7/1969 | Geusic et al. | |
| 3,483,416 A | 12/1969 | Vermeulen | |
| 3,510,732 A | 5/1970 | Amans | |

(Continued)

FOREIGN PATENT DOCUMENTS

BE    1 007 825    10/1995

(Continued)

OTHER PUBLICATIONS

Page 9, "A Dictionary of Metallurgy", 1958.*

(Continued)

Primary Examiner—C. Melissa Koslow
(74) Attorney, Agent, or Firm—Fish & Richardson P.C.

(57) ABSTRACT

The wavelength-converting casting composition is based on a transparent epoxy casting resin with a luminous substance admixed. The composition is used in an electroluminescent component having a body that emits ultraviolet, blue or green light. An inorganic luminous substance pigment powder with luminous substance pigments is dispersed in the transparent epoxy casting resin. The luminous substance is a phosphorous group of the general formula $A_3B_5X_{12}:M$, and the luminous substance pigments have particle sizes $\leq 20$ μm and a mean grain diameter $d_{50} \leq 5$ μm.

17 Claims, 4 Drawing Sheets

U.S. PATENT DOCUMENTS

| | | |
|---|---|---|
| 3,529,200 A | 9/1970 | Potter |
| 3,565,815 A | 2/1971 | Christy |
| 3,573,568 A | 4/1971 | Siegel |
| 3,593,055 A | 7/1971 | Geusic |
| 3,602,758 A | 8/1971 | Thorton |
| 3,621,340 A | 11/1971 | Singh |
| 3,654,463 A | 4/1972 | Geusic et al. |
| 3,659,136 A | 4/1972 | Grodkiewicz |
| 3,691,482 A | 9/1972 | Pinnow et al. |
| 3,699,478 A | 10/1972 | Pinnow et al. |
| 3,700,479 A | 10/1972 | Arents |
| 3,715,611 A | 2/1973 | De Mesquita et al. |
| 3,740,616 A | 6/1973 | Suzuki et al. |
| 3,742,277 A | 6/1973 | Peters |
| 3,742,833 A | 7/1973 | Sewell et al. |
| 3,743,833 A | 7/1973 | Mantic et al. |
| 3,774,086 A | 11/1973 | Vincent, Jr. |
| 3,787,684 A | 1/1974 | Isenberg |
| 3,819,974 A | 6/1974 | Stevenson et al. |
| 3,822,215 A | 7/1974 | Grodkiewicz |
| 3,875,456 A | 4/1975 | Kano et al. |
| 3,932,881 A | 1/1976 | Mita |
| 3,942,185 A | 3/1976 | Lebailly |
| 3,976,877 A | 8/1976 | Thillays |
| 4,093,890 A | 6/1978 | Verriet et al. |
| 4,139,657 A | 2/1979 | Wantanabe |
| 4,146,790 A | 3/1979 | Goetzberger et al. |
| 4,173,495 A | 11/1979 | Rapp et al. |
| 4,178,274 A | 12/1979 | Denk et al. |
| 4,203,792 A | 5/1980 | Thompson |
| 4,262,206 A | 4/1981 | Viehmann |
| 4,298,820 A | 11/1981 | Bongers et al. |
| 4,307,297 A | 12/1981 | Groff et al. |
| 4,365,052 A | 12/1982 | Reeh et al. |
| 4,431,941 A | 2/1984 | Roy et al. |
| 4,479,886 A | 10/1984 | Kasenga ............... 252/301.4 R |
| 4,495,514 A | 1/1985 | Lawrence et al. |
| 4,550,256 A | 10/1985 | Berkstresser et al. |
| 4,599,537 A | 7/1986 | Yamashita |
| 4,684,592 A | 8/1987 | Matsuda et al. |
| 4,707,635 A | 11/1987 | Tateyama et al. |
| 4,710,674 A | 12/1987 | Sigai |
| 4,716,337 A | 12/1987 | Huiskes et al. |
| 4,727,283 A | 2/1988 | Van Kemenade et al. |
| 4,734,619 A | 3/1988 | Havel |
| 4,758,449 A | 7/1988 | Kimura et al. |
| 4,780,752 A | 10/1988 | Angerstein et al. |
| 4,816,369 A | 3/1989 | Matsuda et al. |
| 4,818,434 A | 4/1989 | Lindmayer |
| 4,818,983 A | 4/1989 | Hara et al. |
| 4,825,124 A | 4/1989 | Sigai |
| 4,843,280 A | 6/1989 | Lumbard et al. |
| 4,851,695 A | 7/1989 | Stein |
| 4,875,750 A | 10/1989 | Spaeth et al. |
| 4,894,583 A | 1/1990 | Berkstresser et al. |
| 4,935,856 A | 6/1990 | Dragoon |
| 5,003,181 A | 3/1991 | Morlotti et al. |
| 5,019,746 A | 5/1991 | Merg |
| 5,035,483 A | 7/1991 | Waitl et al. |
| 5,035,513 A | 7/1991 | Fehrenbach et al. |
| 5,107,317 A * | 4/1992 | Takasaki .................... 257/190 |
| 5,126,214 A | 6/1992 | Tokailin |
| 5,166,456 A | 11/1992 | Yoshino |
| 5,184,114 A | 2/1993 | Brown |
| 5,196,763 A | 3/1993 | Yang et al. |
| 5,202,777 A | 4/1993 | Sluzky et al. |
| RE34,254 E | 5/1993 | Dragoon |
| 5,208,462 A | 5/1993 | O'Conner et al. |
| 5,256,725 A | 10/1993 | Eranian et al. |
| 5,294,897 A | 3/1994 | Notani et al. |
| 5,369,289 A | 11/1994 | Tamaki et al. |
| 5,379,186 A | 1/1995 | Gold et al. |
| 5,382,452 A | 1/1995 | Bruno et al. |
| 5,387,836 A | 2/1995 | Adachi et al. |
| 5,417,886 A | 5/1995 | Tateiwa et al. |
| 5,424,573 A | 6/1995 | Kato et al. |
| 5,432,358 A | 7/1995 | Nelson et al. |
| 5,471,113 A | 11/1995 | DeBacker et al. |
| 5,479,050 A | 12/1995 | Pritchard et al. |
| 5,535,230 A | 7/1996 | Abe |
| 5,543,657 A | 8/1996 | Diffenderfer et al. |
| 5,545,386 A | 8/1996 | Kaneyoshi et al. |
| 5,578,839 A | 11/1996 | Nakamura et al. |
| 5,600,202 A | 2/1997 | Yamada et al. |
| 5,602,418 A | 2/1997 | Imai et al. |
| 5,607,621 A | 3/1997 | Ishihara et al. |
| 5,624,602 A | 4/1997 | Lenox et al. |
| 5,635,110 A | 6/1997 | Chandha et al. |
| 5,643,674 A | 7/1997 | Bruno et al. |
| 5,652,438 A | 7/1997 | Sassa et al. |
| 5,656,832 A | 8/1997 | Ohba et al. |
| 5,665,793 A | 9/1997 | Anders |
| 5,670,798 A | 9/1997 | Schetzina |
| 5,685,071 A | 11/1997 | Gates, Jr. et al. |
| 5,707,549 A * | 1/1998 | Matsukiyo et al. ... 252/301.4 R |
| 5,744,233 A | 4/1998 | Opitz et al. ................. 428/328 |
| 5,747,832 A | 5/1998 | Nakamura et al. |
| 5,772,916 A | 6/1998 | Jamil et al. |
| 5,788,881 A | 8/1998 | Chadha et al. |
| 5,798,537 A | 8/1998 | Nitta |
| 5,813,752 A | 9/1998 | Singer et al. |
| 5,813,753 A | 9/1998 | Vriens et al. |
| 5,847,507 A | 12/1998 | Butterworth et al. |
| 5,863,810 A | 1/1999 | Kaldenberg |
| 5,879,647 A | 3/1999 | Wataya et al. |
| 5,906,771 A | 5/1999 | Watkins et al. |
| 5,952,036 A | 9/1999 | Tadaki et al. |
| 5,959,316 A | 9/1999 | Lowery |
| 5,994,722 A | 11/1999 | Averbeck et al. |
| 5,998,925 A * | 12/1999 | Shimizu et al. ............. 313/503 |
| 6,066,861 A * | 5/2000 | Hohn et al. .................... 257/99 |
| 6,069,440 A | 5/2000 | Shimizu et al. |
| 6,078,063 A | 6/2000 | Nakamura et al. |
| 6,085,971 A | 7/2000 | Tews et al. |
| 6,140,040 A | 10/2000 | Palm et al. |
| 6,180,029 B1 | 1/2001 | Hampden-Smith et al. |
| 6,245,259 B1 * | 6/2001 | Hohn et al. ............. 252/301.36 |
| 6,277,301 B1 * | 8/2001 | Hohn et al. ............. 252/301.36 |
| 6,295,750 B1 | 10/2001 | Harwell et al. |
| 6,455,213 B1 | 9/2002 | Lee |
| 6,576,930 B2 | 6/2003 | Reeh et al. |
| 6,592,780 B2 | 7/2003 | Höhn et al. |
| 6,596,141 B2 | 7/2003 | Rasmussen |
| 6,600,175 B1 | 7/2003 | Baretz et al. ................ 257/100 |
| 6,613,247 B1 * | 9/2003 | Hohn et al. ............. 252/301.36 |
| 6,666,993 B2 | 12/2003 | Milewski |
| 6,692,659 B2 | 2/2004 | Brown et al. |
| 6,812,500 B2 | 11/2004 | Reeh et al. |
| 2001/0030326 A1 | 10/2001 | Reeh et al. |
| 2004/0016908 A1 | 1/2004 | Höhn et al. |
| 2004/0016938 A1 | 1/2004 | Baretz et al. ................ 257/100 |
| 2004/0084687 A1 | 5/2004 | Höhn et al. |
| 2005/0127385 A1 | 6/2005 | Reeh et al. |
| 2005/0161694 A1 | 7/2005 | Reeh et al. |

FOREIGN PATENT DOCUMENTS

| | | |
|---|---|---|
| DE | 1915290 | 10/1969 |
| DE | 2018353 C | 10/1970 |
| DE | 2018354 C | 10/1970 |
| DE | 2059909 | 6/1971 |
| DE | 7128442 | 12/1971 |
| DE | 26 42 465 | 3/1978 |
| DE | 90 13 615.2 | 1/1991 |

| | | |
|---|---|---|
| DE | 9013615.2 | 1/1991 |
| DE | 4432035 | 3/1996 |
| DE | 19638667 | 4/1998 |
| EP | 0 039 017 B1 | 11/1981 |
| EP | 0333162 | 9/1989 |
| EP | 0 387 715 | 9/1990 |
| EP | 0486052 A1 | 5/1992 |
| EP | 0 862 794 | 9/1998 |
| EP | 0936682 | 8/1999 |
| FR | 2044727 | 2/1971 |
| FR | 2073134 | 9/1971 |
| GB | 1263185 | 2/1972 |
| GB | 1317731 | 5/1973 |
| GB | 1317732 | 5/1973 |
| GB | 1332462 | 10/1973 |
| GB | 2000173 | 1/1979 |
| GB | 2053953 | 2/1981 |
| GB | 1589964 | 5/1981 |
| GB | 2149416 | 6/1985 |
| JP | 46-7462 | 12/1971 |
| JP | 47-17684 | 9/1972 |
| JP | 48-6962 | 3/1973 |
| JP | 48-39866 | 5/1973 |
| JP | 46-39866 | 6/1973 |
| JP | 49-1221 | 1/1974 |
| JP | 49-24355 | 3/1974 |
| JP | 49-112577 | 10/1974 |
| JP | 49-122292 A | 11/1974 |
| JP | 50-43913 | 4/1975 |
| JP | 50-74875 | 6/1975 |
| JP | 07-176794 | 7/1975 |
| JP | 51145288 | 12/1976 |
| JP | 52-009334 | 1/1977 |
| JP | 9-73807 | 3/1977 |
| JP | 52-40959 | 10/1977 |
| JP | 52-45181 | 10/1977 |
| JP | 53001180 | 1/1978 |
| JP | 53-100787 | 9/1978 |
| JP | 54-066093 | 5/1979 |
| JP | 54-41660 | 12/1979 |
| JP | 55004898 | 1/1980 |
| JP | 56-005884 | 1/1981 |
| JP | 56-058884 | 5/1981 |
| JP | 58-043584 | 3/1983 |
| JP | 59-50455 | 7/1984 |
| JP | 61-240680 | 10/1986 |
| JP | 61-248839 | 11/1986 |
| JP | 62020237 | 1/1987 |
| JP | 62-94659 | 6/1987 |
| JP | 62201989 | 9/1987 |
| JP | 2-91980 | 9/1988 |
| JP | 63-280467 | 11/1988 |
| JP | 64-071053 | 3/1989 |
| JP | 1175103 | 7/1989 |
| JP | 01179471 | 7/1989 |
| JP | 1260707 | 10/1989 |
| JP | 02011694 | 1/1990 |
| JP | 2080970 | 3/1990 |
| JP | 2-138361 | 5/1990 |
| JP | 03220286 | 9/1991 |
| JP | 03287690 | 12/1991 |
| JP | 4110236 | 4/1992 |
| JP | 4-63162 | 5/1992 |
| JP | 4-63163 | 5/1992 |
| JP | 04137570 | 5/1992 |
| JP | 4142070 | 5/1992 |
| JP | 4-175265 | 6/1992 |
| JP | 4-38538 | 9/1992 |
| JP | 5-38926 | 5/1993 |
| JP | 5-152609 | 6/1993 |
| JP | 5-50611 | 7/1993 |
| JP | 5-63068 | 8/1993 |
| JP | 5-72553 | 10/1993 |
| JP | 05315652 | 11/1993 |
| JP | 05315653 | 11/1993 |
| JP | 5335624 | 12/1993 |
| JP | 05347432 | 12/1993 |
| JP | 6013075 | 1/1994 |
| JP | 6017130 | 1/1994 |
| JP | 06053554 | 2/1994 |
| JP | 6-69546 | 3/1994 |
| JP | 06-077540 | 3/1994 |
| JP | 06076754 | 3/1994 |
| JP | 6085314 | 3/1994 |
| JP | 06 104491 | 4/1994 |
| JP | 06163988 | 6/1994 |
| JP | 6-208845 | 7/1994 |
| JP | 06204570 | 7/1994 |
| JP | 6-60009 | 8/1994 |
| JP | 6279568 | 10/1994 |
| JP | 06306356 | 11/1994 |
| JP | 7-99345 | 4/1995 |
| JP | 00799345 | 4/1995 |
| JP | 7-42152 | 7/1995 |
| JP | 7-193281 | 7/1995 |
| JP | 07-292354 | 11/1995 |
| JP | 8-7614 | 1/1996 |
| JP | 8007614 | 1/1996 |
| JP | 08-032120 | 2/1996 |
| JP | 00864860 | 3/1996 |
| JP | 08-096958 | 4/1996 |
| JP | 09 027642 | 1/1997 |
| JP | 9028642 | 2/1997 |
| JP | 081010/1997 | 3/1997 |
| JP | 10 012925 | 1/1998 |
| JP | 10-242513 | 9/1998 |
| JP | 2927229 | 7/1999 |
| JP | 11-220174 | 8/1999 |
| WO | 96/23030 | 8/1996 |
| WO | 97/48138 | 12/1997 |
| WO | WO 98/12757 | 3/1998 |
| WO | W98/05078 | 5/1998 |

OTHER PUBLICATIONS

Translation of the newspaper "Nikkei Sangyo Shimbun", issued on Sep. 13, 1996, *White-LED Lamp Efficient Light Emission Half a Production Cost*, Nichia Chemical.
English Translation of Japanese 01175103 A, Jul. 11, 1989.
English Translation of Japanese 01260707 A, Oct. 18, 1989.
"Phosphor Handbook", Ohm 1987, pp. 275-276, 383.
Nakamuri, T, "Nichia Chemical starts the sample shipment of white light Emitting Diode", Nikkei Electronics, Sep. 23, 1996 (No. 671), pp. 15-16.
"Phosphor and Emitter", Osram GmbH, Jun. 1997.
Proceedings of 264th Institute of Phosphor Society, "Development and Application of high bright white LED Lamps", Nov. 29, 1996, pp. 5-14.
English Translation of Japanese Patent Application No. 018010, Filed Mar. 31, 1997, Nichia Chemical Industries Ltd.
Siemems Components 29.7/8 1991, pp. 147-149.
Drafts of the Society for the Study of Fluorescent Materials, pp. 5-14.
Decision on Trial 11520/90 concerning JP5-152609.
Applied Physics Letters, "Candela-class high-brightness InGaN/AlGaN double-heterostructure blue-light-emitting diodes", Mar. 28, 1994, 64 (13), pp. 1687-1689.
J. Applied Physics, "Large-band gap SiC, III-V nitride, and II-VI Zn-Se-based semiconductor device technologies", Aug. 1, 1994, 76 (3), pp. 1363-1398.
J. Vac. Sci. Technol., InGaN/AlGaN blue-light emitting diode, May/Jun. 1995, A13 (3), pp. 705-710.
Journal of IES (Illuminating Engineering Soc.), "Improved color rendition in high pressure mercury vapor lamps", Jan. 1977, pp. 89-91.

Physical Review, "Frequency Upconversion in YF$_3$:Yb$^{3+}$, Tm3$^{+}$", Apr. 15, 1971, B3 (8), pp. 2698-2705.

J. Applied Physics, "Efficiency of Red, Green, and Blue Infrared-to-Visible Conversion Sources", Apr. 1971, pp. 1958-1960.

English abstract of Japanese Laid-open Patent 10-179471, Jul. 17, 1989.

Translation of Japanese Laid-open Patent 07-176794, Jul. 14, 1995.

Osinski, Marek, AlGaN/InGaN/GaN blue light emitting diode degradation under pulsed current stress, Applied Physics Letter, Aug. 12, 1996, pp. 898-900.

D.J. Robbins: "The Effects of Crystal Field and Temperature on the Photoluminescence Excitation of Ce$^{3+}$in YAG", J. Electrchem. Soc.: Solid State Science and Technology 1979, vol. 126, No. 9, pp. 1550-1555.

Glen A. Slack et al.: "Optical Absorption of Y$_3$A$_{15}$O$_{12}$ from 10- to 55000-cm Wave Numbers", Physical Review, vol. 177, No. 3, Jan. 15, 1969, pp. 1308-1314.

Shuji Nakamura et al.: "The blue laser diode: GaN based Light emitters and lasers", Springer Vertag, Berlin, 1997, pp. 216-219, 328.

G.. Blasse et al.,: "A New Phosphor for Flying -Spot Cathode-Ray Tubes for Color Television: Yellow Emitting Y$^3$Al$_5$O$^{12}$-Ce$_{3+}$", Applied Physics Letter, vol. 11, No. 2, 15, pp. 53, 54.

B.M.J. Smets: "Phosphors Based On Rare-Earths, A New Era in Fluorescent Lighting", Materials Chemistry and Physics, 16 (1987), pp. 283-299.

Cheo et al.: "White Light Emitting glasses", Journal Solid State Chemistry, 1991, pp. 17-29.

Sato et al.: "Full-Color . . . Diode", Jap. J. Applied Physics, vol. 35, (1996), pp. L838-L839.

Siemens Forsch.—Entwichkl.—Ber. Bd (1997), No. 3, p. 162 [Siemens Research and Development Reports], vol. 6.

S.N. Mohammad et al.: "emerging gallium Nitride Based Devices", Proceeding of the IEEE, vol. 83, No. 10, Oct. 1995, pp. 1306-1355.

Schlotter, P. et al., "Luminescence conversion of blue light emitting diodes", Applied Physics A, Springer Verlag, Apr. 1997, vol. 64, No. 4, pp. 417-418.

Japanese Internet Literature "Preparing Nearly-Spherical Aluminate Phosphors of Uniform Size".

Shimizu, Yoshinori et al, Phosphor Handbook, Phosphor Research Society, pp. 317-330, 495-508, 1999.

Journal of the Electrochemical Society, Solid-State Science and Technology, "Preparation of Y$_3$Al$_5$O$_{12}$ Based Phosphor Powders", Feb. 1987, pp. 493-498.

Phosphor and Emitter, Osram GmbH, Jun. 1997.

Material Safety Data Sheet, pp. 1-2, Phosphor Data Sheet of NP-204 of Nichia Corporation, Feb. 1995.

Japanese Internet Literature, "Preparing Nearly-Spherical Aluminate Phosphors of Uniform Size".

Yan et al., *J. Electrochem Soc., Solid State Science and Technology*, Preparation of Y$_3$Al$_5$O$_{12}$-Based Phosphor Powders, Feb. 1987, pp. 493-198.

Hiroaki Kodera et al., "Course of Lectures: Fundamental and Application of Color Image Engineering, No. 5", *Television Gakkaishi (The Journal of the Institute of Television Engineers of Japan)*, vol. 47, 1993, p. 753-764.

R.W.G. Hunt, "Revised Colour-Appearance Model for Related and Unrelated Colours", *Color Research and Application*, vol. 16, No. 3, pp. 146-165 (1991).

Yoshinobu Nayatani, "Revision of the Chroma and Hue Scales of a Nonlinear Color-Appearance Model", *Color Research and Application*, vol. 20, No. 3, pp. 143-155 (1995).

Mitsuo Ikeda et al. "Equivalent Lightness of Colored Objects at Illuminances from the Scotopic to the Photopic Level", *Color Research and Application*, vol. 14, No. 4, pp. 198-206 (1989),.

Mitsuo Ikeda et al., "Equivalent Lightness of Colored Objects of Equal Munsell Chroma and of Equal Munsell Value at Various Illuminances", *Color Research and Application*, vol. 16, No. 2, pp. 72-80 (1991).

Hiroyuki Shinoda et al., "Categorized Color Space on CRT in the Aperture and the Surface Color Mode", *Color Research and Application*, vol. 18, No. 5, pp. 326-333 (1993).

"Change of Color Conspicuity for Various Illuminance Levels Effects of the Purkuinje shift, Shomei Gakkaishi", *Journal of the Illuminating Engineering Institute of Japan*, vol. 17, p. 612-617 (1987).

Shuji Nakamura et al., "High-Quality InGaN Films Grown on GaN Films" *Japanese Journal of Applied Physics*, Part 2, vol. 31, No. 10B, pp. L1457-L1459 (1992).

J.M. Robertson et al., "Colourshift of the Ce$^{3+}$ Emission in Monocrystalline Epitaxially Grown Garnet Layers", *Philips Journal of Research*, vol. 36, No. 1, pp. 15-30. (1981).

K. Bando et al., "Development and Applications of Highbright White LED Lamps", *Proceedings of the 264$^{th}$ Institute of Phosphor Society*, Nov. 29, 1996 at the Institute of Industrial Science of Tokyo University.

Hakkoutai Dougaku Kai (ed), "Keikoutai Handbook" (Handbook on Fluorescent Materials), 1998 edition, Dec. 25, 1987, pp. 275-277.

Robbins et al., Single Crystal Y3A15O12: Tb Phosphor Produced by Ion Implanatation:, *Journal of the Electrochemical Society*, vol. 129, No. 4, pp. 816-820.

Poort et al., "Optical properties of Eu2+-activated orthosilicates and orthophosphates" *Journal of Alloys and Compounds*, vol. 260, No. 1-2, pp. 93-97 (Sep. 12, 1997).

English abstract of Japanese Laid-open 07-099345, Apr. 11, 1995.

Translation of Japanese Laid-open Patent 05-152609, Jun. 18, 1993.

Translation of Japanese Laid-open Patent 08-7614, Jan. 12, 1996.

Translation of Japanese Patent No. 2927279.

Möllmer et al., "Siemens SMT TOP-LED for Surface Mounting", *Siemens Components*, Bd. 26, No. 6, pp. 193-196 (1991).

A.S. Murphy et al., "Breaking the Boundaries of Jameson Cell Capacity" http://www.xstratatech.com/doc/jc_boundaries_en.pdf.

Clive Washington, *Particle Size Analysis in Pharmaceutics and Other Industries Theory and Practice*, Ellis Horwood Limited, (1992), pp. 18-23.

"Phosphor L175" *Phosphors* (Jun. 1997).

"Lamp Phosphor Data Sheet", from Nichia Kagaku Kogyo K.K., (May 16, 1995).

"Representation of results of particle size analysis—Part 2: Calculation of average particle sizes/diameters and moments from particle size distributions", *International Standard, ISO 9276-2*, pp. 1-12 (2001).

Robert H. Perry, Don W. Green, and James O. Maloney (eds.), *Perry's Chemical Engineers' Handbook Seventh Edition*, McGraw Hill (1997), pp. 20-5-20-6.

Shigeo Shionoya and William M. Yen (eds.), *Phosphor Handbook*, CRC Press, pp. 733-776 (1999).

Product Information—Phillips Lighting, Fluorescent Powders (1990).

English Translation of Nikkei Electronics, No. 671, Sep. 23, 1996, p. 15.

English Translation of Japanese Patent Application No. 245381, filed Sep. 18, 1996, Nichia Chemical Industries, Ltd.

English Translation of Japanese Patent Application No. 359004, filed Dec. 27, 1996, Nichia Chemical Industries, Ltd.

English Translation of Japanese Patent Application No. 198585, filed Jul. 29, 1996, Nichia Chemical Industries, Ltd.

*Phosphor Handbook*, (Keikotai Handobukku), Phosphor Research Society (Japan), 1987, pp. 172-174, 188-189, 270, 276, 375, 384-385.

P. Bowen, "Particle Size Distribution Measurement from Millimeters to Nanometers and from Rods to Platelets", *Journal of Dispersion Science and Technology*, vol. 23, No. 5, pp. 631-662 (2002).

P. Bowen et al., "Particle Size Distribution Measurement of Anisotropic Particles - Cylinders and Platelets - Practical Examples", Recents Prog. Genie Procedes Recents Progres en Genie des Pr RPGPEX 15 77, Science et (2001).

Ajit Jillavenkatesa et al., *Practice Guide, Particle Size Characterization*, Special Publication 960-1, pp. 125-137 (Jan. 2001).

Curriculum vitae of Dr. Kevin W. Powers.

Declaration of Dr. Kevin W. Powers in Support of Citizen Electronics Company Ltd.'s Opposition to European Patent 0 862 794 including the refernces cited therein.

Dr. Alan Rawle. "Basic Principles of Particle Size Analysis", Technical Paper by Alan Rawle, Malvern Instruments, Great Britain (1993).

P. Schlotter et al., "Luminescence conversion of blue light emitting diodes", *Applied Physics A*, Materials Science & Processing, Rapid Communication, vol. A, pp. 417-418 (Apr. 1997).

Cabot, "Creating What Matters", "Overview", "Cabot PEDs Technology", and "Glossary Terms".

Kirk-Othmer Encyclopedia of Chemical Technology, fourth Edition, Chapter "Pigments (Inorganic)", vol. 19, pp. 1-40, John Wiley & Sons, Inc. New York (1996).

Phosphor Handbook (English version), pp. 351-353; 495-508; 733-738; 317-330.

Phosphor Handbook (English version), inside page, pp. 732-759.

Phosphor Technology, "Particle Size Analysis".

R L Smith/Environmental Health Perspectives, "Review of Glycol Ether and Glycol Ether Ester Solvents Used in the Coating Industry", v. 57, pp. 1-4 (1984).

Mitsubishi Electronics Technical Journal (Mitsubishi Denki Giho), vol. 48, No. 9, pp. 1121-1123 (Sep. 1974) (English Version).

English Translation of Japanese Patent No. 4-63162 dated May 29, 1992.

Nullity Request by Josef Schmidt to the German Patent Office In the name of and on behalf of Nichia Corporation of Japan dated Dec. 3, 2001.

Notice of Intervention from the European Patent Office dated Jan. 19, 2006 with regard to European Application No. 97909167.5 - 2203 / 0862794.

Mary V. Hoffman, "Improved color rendition in high pressure mercury vapor lamps", *Journal of IES*, pp. 89-91 (Jan. 1977).

Shuji Nakamura, "Present perfromance of InGaN based blue/green/yellow LEDS", *SPIE*, vol. 3002, pp. 26-35 (Feb 13-14, 1997).

A.D. Merriman, A Dictionary of Metallurgy, MacDonald & Evan, Ltd. London, p. 9 (1958).

*In the Matter of Certain Light-Emitting Diods and Products Containing Same*, Inv. No. 337-TA-512, "Initial Determination on Remand Regarding the Particle Size Patents", Dated Oct. 31, 2005 (Public Version).

Demand for Trial dated Mar. 3, 2000 re: JP 2927279.

Written Reply dated Jun. 20, 2000 re: JP 2927279.

Nichia Optoelectronic Product Guide, Nichia Chemical Industries, Oct. 1996.

Office Action in Japanese Patent Application 10-514190, translation dated Jun. 5, 2001.

Preliminary Decision on Demand for Trial of JP 2927279 dated Apr. 9, 2001.

ASTM Designation E 1617-97, "Standard Practice for Reporting Particle Size Characterization Data".

Phosphor Handbook, Ohmsha, Japanese Version, English Translation of Cover, inside page, pp. 172-173; 188-189; 188-189; 268-269; 275-276; and 383-386 (1987).

Office Action from Application No. 10/616,783, filed on Jul. 10, 2003, dated May 4, 2006.

C.M. Wong et al., "Optical studies of cerium doped yttrium aluminum garnet single crystals", *Applied Physics Letters*, vol. 44, No. 11, p. 1038-1040 (Jun. 1, 1984).

Copy of Japanese Office Action dated Jun. 14, 2006.

Phosphor Handbook, Ohmsha, Japanese Version, *Phosphor Research Society*, pp. 222-228, 237, 238 and 268-270, (Dec. 25, 1987).

Brief of Appellants Osram GmbH and Osram Opto Semiconductors GmbH, United States Court of Appeals for the Federal Circuit, No. 2006-1282, dated Aug. 11, 2006.

Brief of Appellee International Trade Commission, United States Court of Appeals for the Federal Circuit, No. 2006-1282, dated Oct. 10, 2006.

Reply Brief of Appellants Osram GmbH and Osram Opto Semiconductor GmbH, United States Court of Appeals for the Federal Circuit, No. 2006-1282, dated Nov. 3, 2006.

* cited by examiner

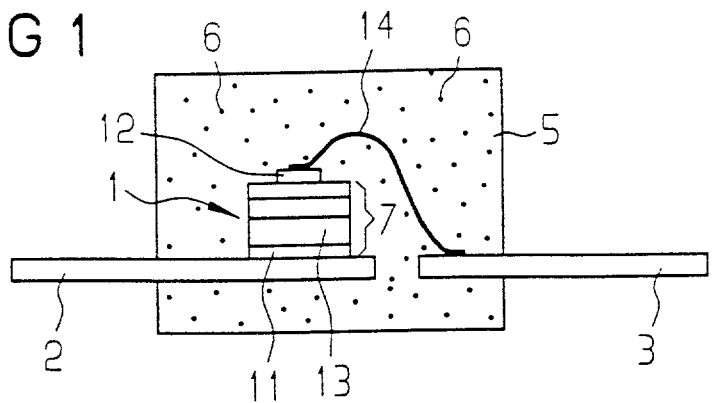
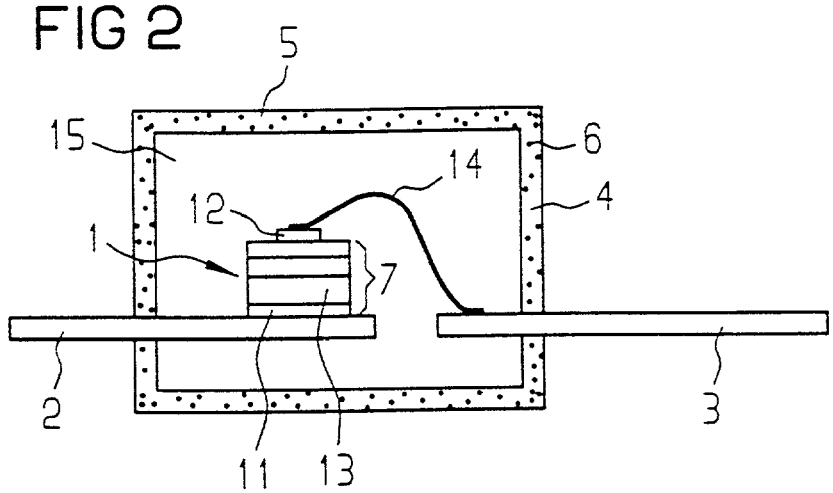
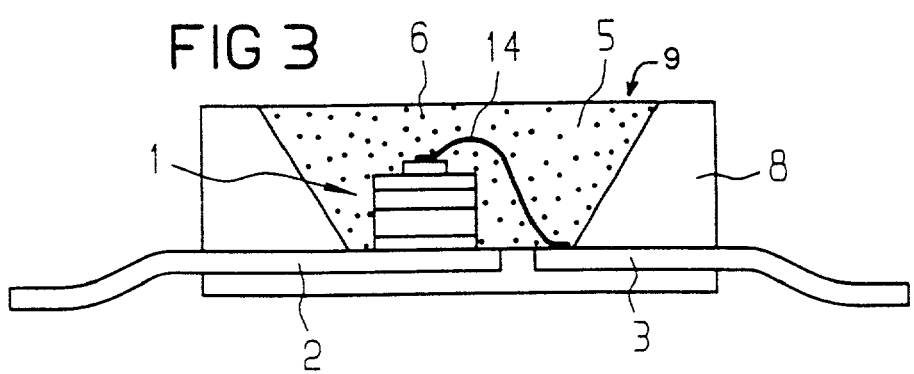

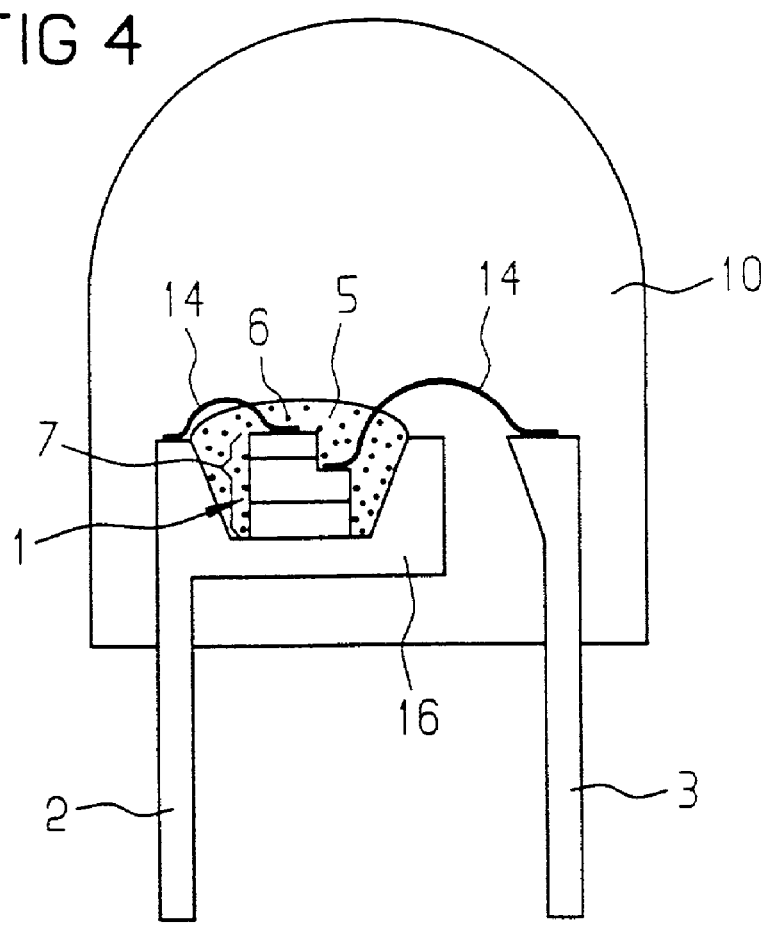
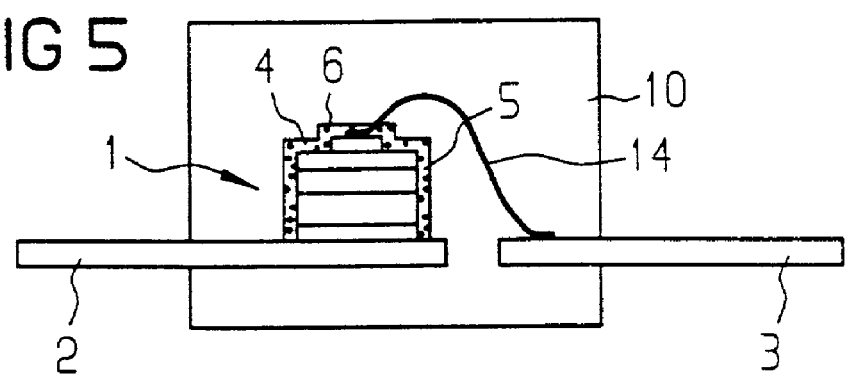

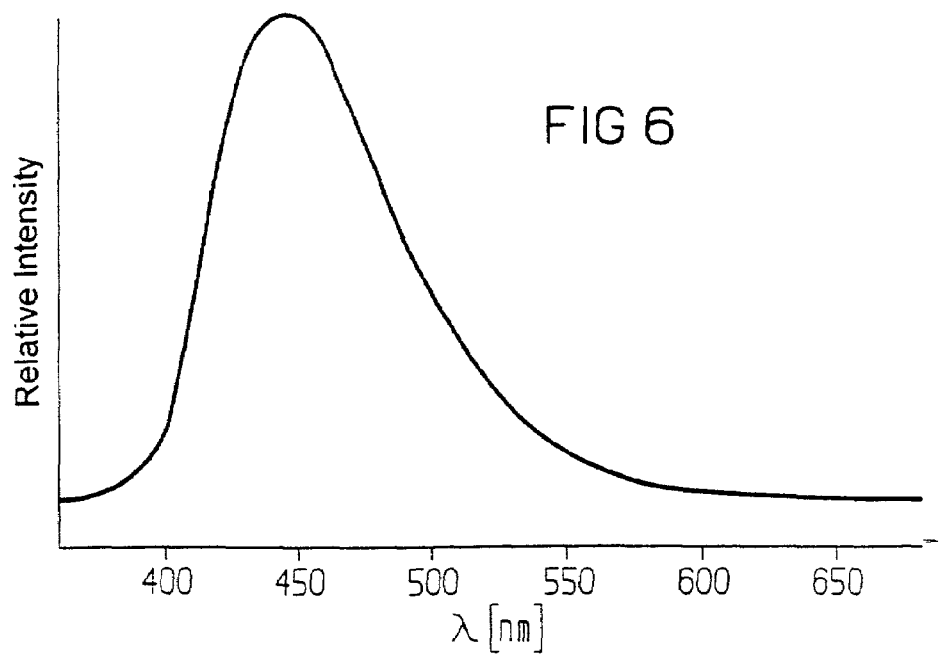
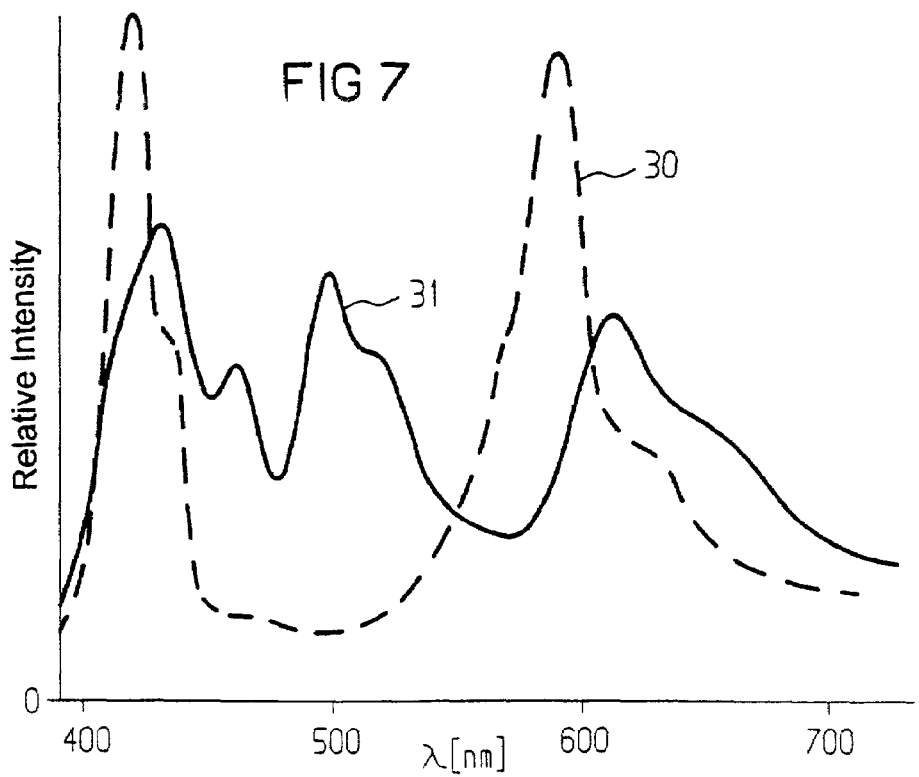

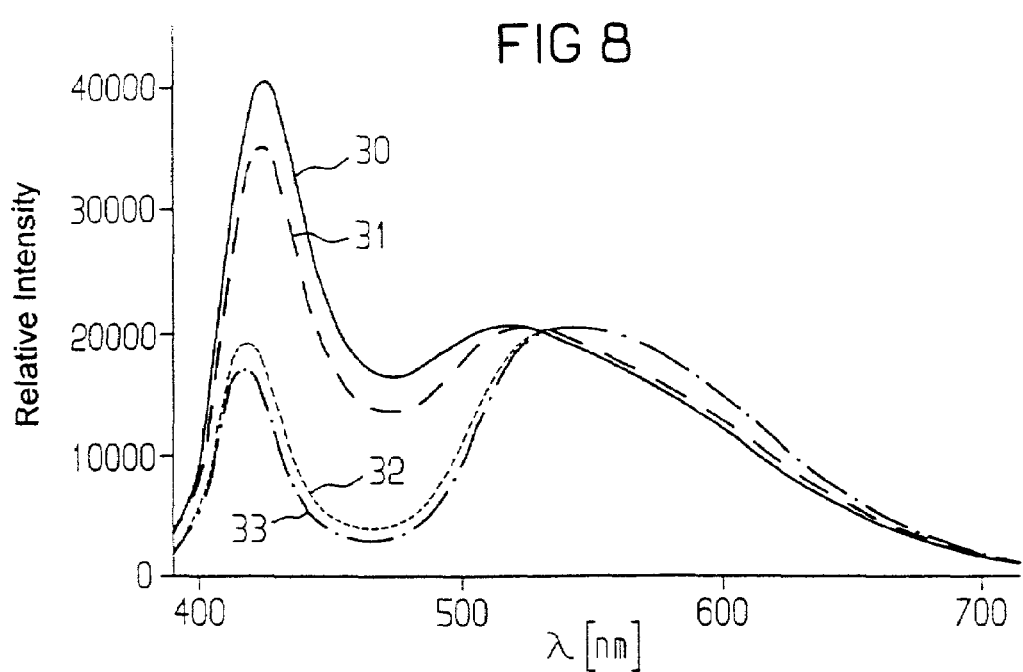

METHOD OF PRODUCING A WAVELENGTH-CONVERTING CASTING COMPOSITION

CROSS-REFERENCE TO RELATED APPLICATION

This is a division of U.S. patent application Ser. No. 09/536,564, dated Mar. 28, 2000, now U.S. Pat. No. 6,277,301, which is a division of U.S. application Ser. No. 09/082,205, filed May 20, 1998, now U.S. Pat. No. 6,066,861, which was a continuation of copending international application PCT/DE97/02139, filed Sep. 22, 1997, which designated the United States.

BACKGROUND OF THE INVENTION

1. Field of the Invention

The invention relates to a wavelength-converting casting composition based on a transparent epoxy casting resin which is mixed with a luminous substance, for an electroluminescent component having a body that emits ultraviolet, blue or green light.

2. Description of the Related Art

A component of that type has become known, for instance, from German published, non-prosecuted patent application DE 38 04 293. The reference describes an arrangement with an electroluminescent diode or laser diode, in which the emissions spectrum emitted by the diode is shifted toward longer wavelengths, by means of a plastic element mixed with a fluorescing, light-converting, organic colorant. The light emitted by the arrangement as a result has a different color from what the light emitting diode emitted. Depending on the type of colorant added to the plastic, it is possible to produce LED arrays that light up in different colors with one and the same type of light-emitting diode (LED).

In many potential applications for LEDs, such as in display elements in motor vehicle dashboards, illumination in aircraft and automobiles, and in LED displays capable of showing full color, there is an increasing demand for LED arrays with which mixed color light and in particular white light can be generated.

However, the prior art casting compositions of the type referred to at the outset with organic luminous substances exhibit a shift in the color location, that is, the color of the light emitted by the electroluminescent component, under temperature and temperature/humidity stresses.

Japanese patent disclosure JP-07 176 794-A describes a white-light-emitting planar light source, in which two diodes that emit blue light are disposed on one face end of a transparent plate and emit light into the transparent plate. The transparent plate is coated on one of the two opposed main sides with a fluorescing substance that emits light when it is excited with the blue light of the diodes. The light emitted by the fluorescing substance has a different wavelength from the blue light emitted by the diodes. In this known component, it is especially difficult to apply the fluorescing substance in such a way that the light source emits homogeneous white light. Moreover, replicability and mass production presents major problems, because even slight fluctuations in the layer thickness of the fluorescing layer, for instance from irregularities of the surface of the transparent plate, cause a change in the white of the light emitted.

SUMMARY OF THE INVENTION

It is accordingly an object of the invention to provide a wavelength-converting casting mass, which overcomes the above-mentioned disadvantages of the prior art devices and methods of this general type and with which electroluminescent components can be produced that emit homogeneous mixed-colored light, and which enables mass production at reasonable engineering effort and expense and with maximally replicable component characteristics. The emitted light should be color-stable even under temperature and temperature/humidity stresses. It is a further object to specify a use for the casting mass and a method for producing the composition.

With the foregoing and other objects in view there is provided, in accordance with the invention, a wavelength-converting casting composition, for converting a wavelength of ultraviolet, blue or green light emitted by an electroluminescent component, comprising:

a transparent epoxy casting resin;

an inorganic luminous substance pigment powder dispersed in the transparent epoxy resin, the pigment powder comprising luminous substance pigments from a phosphorus group having the general formula $A_3B_5X_{12}$:M;

the luminous substance pigments having grain sizes $\leq 20$ µm and a mean grain diameter $d_{50} \leq 5$ µm.

In accordance with an added feature of the invention, the mean grain diameter $d_{50}$ of the luminous substance pigments is between one and two micrometers.

Inorganic/mineral luminous substances are extremely stable with regard to temperature and temperature/humidity stresses.

In accordance with an additional feature of the invention, the composition includes the following parts:

a) epoxy casting resin $\leq 60\%$ by weight;
b) luminous substance pigments >0 and $\leq 25\%$ by weight;
c) thixotropic agent >0 and $\leq 10\%$ by weight;
d) mineral diffusor >0 and $\leq 10\%$ by weight;
e) processing adjuvant >0 and $\leq 3\%$ by weight;
f) hydrophobic agent >0 and $\leq 3\%$ by weight; and
g) adhesion promoters >0 and $\leq 2\%$ by weight.

Suitable epoxy casting resins are described for instance in German published, non-prosecuted patent application 26 42 465 (pp. 4–9, in particular examples 1–4), and in European patent disclosure EP 0 039 017 and U.S. Pat. No. 4,365,052 (pp. 2–5, in particular examples 1–8 appearing in both the EP and U.S. patents). The disclosures of those documents are hereby expressly incorporated by reference.

Pyrogenic silicic acid is for instance used as the thixotropic agent. The thixotropic agent is used to thicken the epoxy casting resin, so as to reduce the sedimentation of the luminous substance pigment powder. The flow and wetting properties are also adjusted for processing the casting resin $CaF_2$ is preferably used as a mineral diffusor for optimizing the luminous pattern of the component.

Glycol ether is for instance suitable as a processing adjuvant. It improves the compatibility between the epoxy casting resin and the luminous substance pigment powder and is thus used to stabilize the dispersion of luminous substance pigment powder and epoxy casting resin. To that end, surface modifiers based on silicone can also be employed.

The hydrophobic agent, such as liquid silicone wax, is also used to modify the pigment surface; in particular, the compatibility and wettability of the inorganic pigment surface is improved with the organic resin.

The adhesion promoter, such as functional alkoxysiloxane, improves the adhesion between the pigments and the epoxy resin in the cured state of the casting composition. As a result it is attained that the boundary face between the epoxy resin and the pigments will not rupture, for instance in response to temperature fluctuations. Gaps between the epoxy resin and the pigments would cause light losses in the component.

The epoxy casting resin, preferably with a reactive triple oxiran ring, preferably includes a monofunctional and/or multifunctional epoxy casting resin system ($\geqq 80\%$ by weight, such as bisphenol-A-diglycidyl ether), a reactive diluent ($\leqq 10\%$ by weight, such as aromatic monoglycidyl ether), a multifunctional alcohol ($\leqq 5\%$ by weight), a degassing agent based on silicone ($\leqq 1\%$ by weight), and a decolorizing component to adjust the color number ($\leqq 1\%$ by weight).

In accordance with another feature of the invention, the luminous substance pigments are substantially spherical particles or flakelike particles. The tendency to clumping of such pigments is advantageously very slight. The $H_2O$ content is below 2%.

In the production and processing of epoxy casting resin components with inorganic luminous substance pigment powders, in general not only wetting but also sedimentation problems occur. Especially luminous substance pigment powders with $d_{50} \leqq 5$ µl have a strong tendency to clumping. In the last-named composition of the casting composition, the luminous substance pigments, with the above-indicated particle size, can advantageously be substantially free of clumps and can be dispersed homogeneously in the epoxy casting resin. This dispersion is stable even under long-term storage of the casting composition. Essentially no problems of wetting and/or sedimentation occur.

In accordance with a further feature of the invention, the luminous substance pigments are particles of Ce-doped garnets, such as, particularly, YAG:Ce particles. An advantageous dopant concentration is 1%, for example, and an advantageous luminous substance concentration is 12%, for example. The preferred high-purity luminous substance pigment powder also advantageously has an iron content of $\leqq 5$ ppm. A high iron content leads to high light losses in the component. The luminous substance pigment powder is highly abrasive. The iron content in the casting composition can therefore rise considerably during production. Iron contents in the casting composition <20 ppm are advantageous.

The inorganic luminous substance YAG:Ce has the particular advantage, among others, that is involves insoluble color pigments with an index of refraction of approximately 1.84. As a result, along with the wavelength conversion, dispersion and scattering effects occur that lead to good mixing of blue diode emissions with yellow converter radiation.

It is also especially advantageous that the luminous substance concentration in the epoxy resin when inorganic luminous substance pigments are used is not limited by the solubility, as is the case for organic colorants.

For further reduction of clumping, the luminous substance pigments may advantageously be provided with a silicone coating.

With the above and other objects in view there is also provided, in accordance with the invention, a method of producing a wavelength-converting casting composition, for converting a wavelength of ultraviolet, blue or green light emitted by an electroluminescent component, the method which comprises:

providing a base of transparent epoxy casting resin;

providing a luminous substance pigment powder of luminous substance pigments from a phosphorus group having the general formula $A_3B_5X_{12}$:M; tempering the luminous substance pigment powder at a temperature of $\leqq 200°$ C. and subsequently mixing the tempered pigment powder with the epoxy casting resin.

Tempering is preferably effected for approximately ten hours. As a result, again the tendency to clumping can be reduced.

As an alternative or in addition for this purpose, the luminous substance pigment powder, before being mixed with the epoxy casting resin, can be slurried in a high-boiling point alcohol and subsequently dried. A further possibility for reducing clumping is to add a hydrophobic silicone wax to the luminous substance pigment powder before the powder is mixed with the epoxy casting resin. Surface stabilization of the phosphors by heating the pigments in the presence of glycol ethers, for instance for 16 hours at T>60° C., is especially advantageous.

To avoid problematic contamination upon dispersal of the luminous substance pigments, caused by abrasion, reaction vessels, agitators and dispersing devices as well as rolling mechanisms of glass, corundum, carbide and nitride materials as well as especially hardened types of steel are used. Clump-free luminous substance dispersions are also obtained by ultrasonic methods or by the use of screens and glass ceramic frits.

An especially preferred inorganic luminous substance for producing optoelectronic components that light up white is the phosphorous YAG:Ce ($Y_3Al_5O_{12}$:$Ce^{3+}$). This phosphorous can be especially simply mixed with transparent epoxy casting resins conventionally used in LED technology. Also conceivable as luminous substances are other garnets, doped with rare earths, such as $Y_3Ga_5O_{12}$:$Ce^{3+}$, $Y(Al, Ga)_5O_{12}$:$Ce^{3+}$, and $Y(Al, Ga)_5O_{12}$:$Tb^{3+}$.

To generate mixed-colored light, the thiogallates doped with rare earths are moreover especially suitable, examples being $CaGa_2S_4$:$Ce^{3+}$ and $SrGa_2S_5$:$Ce^{3+}$. Once again, the use of aluminates doped with rare earths, such as $YAlO_3$:$Ce^{3+}$, $YGaO_3$:$Ce^{3+}$, $Y(Al, Ga)O_3$:$Ce^{3+}$, and orthosilicates doped with rare earths, $M_2SiO_5$:$Ce^{3+}$, (M:Sc,Y,Sc), such as $Y_2SiO_5$:$Ce^{3+}$ is conceivable. In all the yttrium compounds, the yttrium can in principle also be replaced with scandium or lanthanum.

Therefore, in the phosphorus group $A_3B_5X_{12}$:M, the variables may stand for the following exemplary elements: A=Y, Ca, Sr; B=Al, Ga, Si; X=O, S; and M=$Ce^{3+}$, $Tb^{3+}$. The variables can represent a single one of the listed exemplary elements. Alternatively, the variables can represent a mixture of two or more of the listed exemplary elements.

Preferably, the casting composition according to the invention is used in a radiation-emitting semiconductor body, in particular with an active semiconductor layer or semiconductor layer sequence of $Ga_xIn_{1-x}N$ or $Ga_xAl_{1-x}N$, which in operation emits an electromagnetic radiation of the ultraviolet, blue and/or green spectral range. The luminous substance particles in the casting composition convert some of the radiation originating in this spectral range into radiation with a longer wavelength, in such a way that the semiconductor component emits mixed radiation, and in particular mixed-colored light comprising this radiation as well as radiation from the ultraviolet, blue and/or green spectral range. This means for instance that the luminous substance particles spectrally selectively absorb some of the radiation emitted by the semiconductor body and emit in the longer-wave range. Preferably, the radiation emitted by the semiconductor body has a relative maximum intensity at a wavelength lambda $\lambda \leq 520$ nm, and the wavelength range spectrally selectively absorbed by the luminous substance particles is outside this maximum intensity.

It is also advantageously possible for a plurality of different kinds of luminous substance particles, which emit at different wavelengths, to be dispersed in the casting composition. This is preferably achieved by means of different doping in different host lattices. This advantageously makes it possible to generate manifold color mixtures and color temperatures of the light emitted by the component. This is especially of interest for LEDs capable of emitting full color.

In a preferred use of the casting composition of the invention, a radiation-emitting semiconductor body (such as an LED chip) is at least partly enclosed by the casting composition. The casting composition is preferably simultaneously used as a component envelope (housing). The advantage of a semiconductor component in accordance with this embodiment is essentially that conventional production lines used to make conventional LEDs (such as radial LEDs) can be used to produce it. For the component envelope, instead of the transparent plastic used for this purpose in conventional LEDs, the casting composition can simply be employed.

With the casting composition of the invention, it is possible in a simple way, with a single colored light source, particularly an LED with a single semiconductor body that emits blue light, to create mixed-colored and in particular white light. For instance to generate white light with a semiconductor body that emits blue light, some of the radiation emitted by the semiconductor body is converted out of the blue spectral range into the yellow spectral range, which is complementary in color to blue, by means of inorganic luminous substance particles.

The color temperature or color location of the white light can be varied by a suitable choice of the luminous substance, its particle size, and its concentration. In addition, luminous substance mixtures can also be employed, and as a result advantageously the desired tonality of the color of the emitted light can be adjusted very precisely.

Especially preferably, the casting composition is used in a radiation-emitting semiconductor body in which the emitted radiation spectrum has a maximum intensity at a wavelength between 420 nm and 460 nm, and in particular at 430 nm (examples being semiconductor bodies based on $Ga_xAl_{1-x}N$) or 450 nm (such as semiconductor bodies based on $Ga_xIn_{1-x}N$). With such a semiconductor component, nearly all the colors and mixed colors in the CIE chromaticity diagram can advantageously be generated.

Instead of the radiation-emitting semiconductor body of electroluminescing semiconductor material, however, some other electroluminescing material may be used, such as polymer material.

With the objects of the invention in view there is further provided, in accordance with the invention, a light-emitting semiconductor component, comprising:

a semiconductor body formed of a semiconductor layer sequence and being capable, during an operation of the semiconductor component, of emitting electromagnetic radiation in at least one of an ultraviolet, blue, and green spectral range;

a wavelength-converting casting composition disposed in a vicinity of the semiconductor body, the casting composition being formed of a transparent epoxy casting resin and an inorganic luminous substance pigment powder dispersed in the transparent epoxy resin, the pigment power comprising luminous substance pigments from a phosphorus group having the general formula $A_3B_5X_{12}$:M and having grain sizes $\leq 20$ µm and a mean grain diameter $d_{50} \leq 5$ µm;

the luminous substance pigments converting a portion of the radiation originating from the ultraviolet, blue and green spectral range into radiation of a higher wavelength, such that the semiconductor component emits mixed radiation including the higher-wavelength radiation and radiation from at least one of the ultraviolet, blue and green spectral range.

In other words, the casting composition is especially suitable for a light-emitting semiconductor component (for instance an LED), in which the electroluminescing semiconductor body is disposed in a recess of a prefabricated housing, optionally already provided with a leadframe, and the recess is provided with the casting composition. This kind of semiconductor component can be produced in great numbers on conventional production lines. All that is needed, after mounting of the semiconductor body in the housing, is to fill the recess with the casting composition.

A semiconductor component that emits white light can be produced with the casting composition according to the invention advantageously by choosing the luminous substance in such a way that a blue radiation emitted by the semiconductor body is converted into complementary wavelength ranges, in particular blue and yellow, or additive color triads, such as blue, green and red. The yellow or green and red light is generated via the luminous substances. The color tonality (color location in the CIE chromaticity diagram) of the white light thus produced can then be varied by means of a suitable choice of the luminous substance or luminous substances in terms of their mixture and concentration.

To improve the mixing of the radiation emitted by an electroluminescing semiconductor body with the radiation converted by the luminous substance and thus to improve the homogeneity of color of the light emitted by the component, in an advantageous feature of the casting composition according to the invention a blue-luminescing colorant, which attenuates a so-called directional characteristic of the radiation emitted by the semiconductor body. The term "directional characteristic" is understood to mean that the radiation emitted by the semiconductor body has a preferential emission direction.

A semiconductor component according to the invention that emits white light, with an electroluminescing semiconductor body emitting blue light, can be especially preferably achieved by admixing the inorganic luminous substance YAG:Ce ($Y_3Al_5O_{12}$:$Ce^{3+}$) with the epoxy resin used for the casting composition. Some of the blue radiation emitted by the semiconductor body is shifted by the inorganic luminous substance ($Y_3Al_5O_{12}Ce^{3-}$) into the yellow spectral range and thus into a wavelength range that is complementary in color to the color blue. The color tonality (color location in the CIE chromaticity diagram) of the white light can then be varied by means of a suitable choice of the colorant concentration.

In addition, light-scattering particles, so-called diffusers, can be added to the casting composition. As a result, the color impression and the emission characteristics of the semiconductor component can advantageously be still further optimized.

With the casting composition of the invention, advantageously an ultraviolet radiation emitted by an electroluminescing semiconductor body along with the visible radiation can advantageously be converted into visible light. This markedly increases the brightness of the light emitted by the semiconductor body.

A particular advantage of semiconductor components according to the invention that emit white light, and in which YAG:Ce is used in particular as the luminescence-converting colorant, is that this luminous substance on excitation with blue light causes a spectral shift of approximately 100 nm between absorption and emission. This leads to a substantial reduction and reabsorption of the light emitted by the luminous substance and thus to a higher light yield. Moreover, YAG:Ce advantageously has high thermal and photochemical (such as UV) stability (substantially higher than organic luminous substances) so that even white-emitting diodes for outdoor use and/or high temperature ranges can be produced.

YAG:Ce has by now proved itself to be the best-suitable luminous substance in terms of reabsorption, light yield, thermal and photochemical stability, and processability. However, the use of other Ce-doped phosphors, in particular Ce-doped types of garnet, is also conceivable.

The wavelength conversion of the primary radiation is determined by the crystal field cleavage of the active transition metal centers in the host lattice. By substituting Gd and/or Lu for Y, or Ga for Al in the $Y_3Al_5O_{12}$ garnet lattice, the emission wavelengths can be shifted in various ways, and this can also be done by the type of doping. By substituting $Eu^{3+}$ and/or $Cr^{3+}$ for $Ce^{3+}$ centers, corresponding shifts can be brought about. Corresponding dopings with $Nd^{3+}$ and $Er^{3+}$, even make it possible, because of the greater ion radii and thus reduced crystal field cleavage, to make components that emit infrared (IR) light.

Other features which are considered as characteristic for the invention are set forth in the appended claims.

Although the invention is illustrated and described herein as embodied in a wavelength converting casting composition, its use, and method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic sectional view of a first semiconductor component with a casting composition according to the invention;

FIG. 2 is a schematic sectional view of a second semiconductor component with a casting composition according to the invention;

FIG. 3 is a schematic sectional view of a third semiconductor component with a casting composition according to the invention;

FIG. 4 is a schematic sectional view of a fourth semiconductor component with a casting composition according to the invention;

FIG. 5 is a schematic sectional view of a fifth semiconductor component with a casting composition according to the invention;

FIG. 6 is a graph of an emission spectrum of a semiconductor body that emits blue light, with a layer sequence on the basis of GaN;

FIG. 7 is a graph of the emissions spectra of two semiconductor components with a casting composition according to the invention, which emit white light; and FIG. 8 is a graph of the emissions spectra of further semiconductor components that emit white light.

DESCRIPTION OF THE PREFERRED EMBODIMENTS

Reference is now had to the figures of the drawing in which elements that are identical or that function identically are identified by the same reference numerals throughout.

In the light-emitting semiconductor component of FIG. 1, the semiconductor body 1 is secured by its back-side contact 11 to a first electrical terminal 2 by means of an electrically conductive joining means such as a metal solder or an adhesive. The front-side contact 12 is joined to a second electrical terminal 3 by means of a bond wire 14.

The free surfaces of the semiconductor body 1 and portions of the electrical terminals 2 and 3 are enclosed directly by a hardened, wavelength-converting casting or potting composition 5. The casting composition preferably has the following: epoxy casting resin 80 to 90% by weight, luminous substance pigments (YAG:Ce)≦15% by weight, diethylene glycol monomethyl ether ≦2% by weight, Tegopren 6875-45 (a processing adjustment, an additive for keeping the surface of the resin free from bubbles, craters and similar faults)≦2% by weight, Aerosil 200 (a thixotropic agent)≦5% by weight.

The exemplary embodiment of a semiconductor component according to the invention shown in FIG. 2 differs from that of FIG. 1 in that the semiconductor body 1 in portions of the electrical terminals 2 and 3 are enclosed not by a wavelength-converting potting mass but by a transparent envelope 15. The transparent envelope 15 does not cause any change in the wavelength of the radiation emitted by the semiconductor body 1 and for instance comprises an epoxy, silicone or acrylate resin conventionally used in LED technology, or some other suitable radiation-permeable material, such as inorganic glass.

A layer 4 is applied to the transparent envelope 15. The layer 4 comprises a wavelength-converting casting composition and, as shown in FIG. 2, covers the entire surface of the envelope 15. It is equally conceivable for the layer 4 to cover only a portion of the surface. The layer 4 for instance comprises a transparent epoxy resin which is mixed with luminous substance particles 6. Once again, for a semiconductor component that emits white light, YAG:Ce is preferred as the luminous substance.

FIG. 3 illustrates a particularly advantageous and preferred embodiment of the invention. The first and second electrical terminals 2, 3 are embedded in an opaque, and optionally prefabricated, basic housing 8 that has a recess 9. The term "prefabricated" is understood to mean that the basic housing 8 is already finished at the terminals 2, 3, for instance by means of injection molding, before the semiconductor body is mounted on the terminal 2. The basic housing 8, by way of example, is formed of opaque plastic, and in terms of its form the recess 9 is embodied as a reflector 17 for the radiation emitted by the semiconductor body in operation (the reflection optionally being achieved by means of suitable coating of the inside walls of the recess 9). Such basic housings 8 are used in particular for LEDs that are surface-mounted on printed circuit boards. They are applied, before mounting of the semiconductor body, to a conductor strip (lead frame) that has the electrical terminals 2, 3, the application for instance being done by injection molding.

The recess 9 is filled with a casting composition 5, whose composition is equivalent to that given above in conjunction with the description of FIG. 1.

FIG. 4 shows a so-called radial diode. Here, the electroluminescing semiconductor body 1 is secured, for instance by soldering or adhesive bonding, in a part 16, embodied as a reflector, of the first electrical terminal 2. Such housing constructions are known in LED technology and therefore require no further description here. The free surfaces of the semiconductor body 1 are covered directly by a casting composition 5 containing luminous substance particles 6, and the casting composition in turn is surrounded by a further transparent housing envelope 10.

It will be appreciated by those skilled in the art that, in the construction of FIG. 4 as well, analogously to the component of FIG. 1, an integral envelope comprising hardened casting composition 5 with luminous substance particles 6, may also be used.

In the exemplary embodiment of FIG. 5, a layer 4 (see the list of materials given above) is coated directly on the semiconductor body 1. The semiconductor body 1 and portions of the electrical terminals 2, 3 are enclosed by a further transparent housing envelope 10. The latter causes no change in wavelength of the radiation that has passed through the layer 4, and it is made for instance from a transparent epoxy resin that is usable in LED technology, or from glass.

Such semiconductor bodies 1 provided with a layer 4 and without an envelope can naturally advantageously be used in all the housing constructions known from LED technology (such as SMD housings, and radial housings; see FIG. 4).

In all the components described above, in order to optimize the color impression of the light emitted and to adapt the emission characteristics, the casting composition 5, optionally the transparent envelope 15, and/or optionally the further transparent envelope 10 may have light-scattering particles, advantageously so-called diffusers. Examples of such diffusers are mineral fillers, in particular $CaF_2$, $TiO_2$, $SiO_2$, $CaCO_3$, or $BaSO_4$, or organic pigments. These materials can easily be added to epoxy resins.

FIGS. 6–8 illustrate emissions spectra. FIG. 6 refers to a semiconductor body that emits blue light (luminescence maximum at $\lambda{\sim}430$ nm) and FIGS. 7 and 8 refer to semiconductor components that emit white light. In each case, the wavelength $\lambda$ is plotted in nm on the abscissa, and a relative electroluminescence (EL) intensity is plotted on the ordinate.

Of the radiation emitted by the semiconductor body in FIG. 6, only some is converted into a longer-wavelength range, so that white light is created as the mixed color. The dashed line 30 in FIG. 7 represents an emissions spectrum of a semiconductor component which emits radiation comprising two complementary wavelength ranges (blue and yellow) and thus emits combined white light. The emissions spectrum here has one maximum each at wavelengths between approximately 400 and approximately 430 nm (blue) and between approximately 550 and 580 nm (yellow). The solid line 31 represents the emissions spectrum of a semiconductor component that mixes the color white from three wavelength ranges (additive color triad comprising blue, green and red). The emissions spectrum here has one maximum each for the wavelengths of approximately 430 nm (blue), approximately 500 nm (green) and approximately 615 nm (red).

FIG. 8 shows an emissions spectrum of a white-emitting semiconductor component, which is provided with a semiconductor body that transmits an emissions spectrum as shown in FIG. 6 and in which YAG:Ce is used as the luminous substance. Of the radiation shown in FIG. 6 emitted by the semiconductor body, only some is converted into a longer-wavelength range, so that white light is created as a mixed color. The variously dashed lines 32—33 of FIG. 8 represent emissions spectra of semiconductor components according to the invention, in which the epoxy resin of the casting composition 5 has different YAG:Ce concentrations. Each emissions spectrum has one maximum intensity between lambda=420 nm and lambda=430 nm (i.e., in the blue spectrum), and between lambda=520 mm and lambda=545 nm (i.e., in the green 15 spectrum). The emission bands having the longer-wavelength maximum intensity are predominantly located in the yellow spectral range. The graph of FIG. 8 shows that in the semiconductor component of the invention, the CIE color location of the white light can be varied in a simple way by varying the luminous substance concentration in the epoxy resin.

While the foregoing specification refers specifically to a semiconductor body, for example LED chips or laser diode chips, the invention is not in the least restricted to these embodiments. The term may also be understood to mean a polymer LED, for instance, that emits an equivalent radiation spectrum.

We claim:

1. A method of producing a wavelength-converting casting composition for application on an ultraviolet, blue or green light emitting body, the wavelength-converting casting composition containing luminous substance pigments having grain sizes $\leq 20$ μm and a mean grain diameter $d_{50} \leq 5$ μm, the method which comprises:

providing a base of transparent epoxy casting resin;

providing the luminous substance pigments from a phosphorus group having the general formula $A_3B_5X_{12}$:M, where A is at least one element selected from the group consisting of Y, Gd, Lu, Sc. and La; B is at least one element selected from the group consisting of Al and Ga; X is oxygen; and M is at least one element selected from the group consisting of Ce, Eu, Cr, Nd, Er, and Tb; and mixing the luminous substance pigments with the base.

2. The method according to claim 1, which comprises, prior to the mixing step, slurrying the luminous substance pigments in a high-boiling alcohol and subsequently drying the luminous substance pigments.

3. The method according to claim 1, which comprises, prior to the mixing step, adding hydrophobic silicone wax to the luminous substance pigments.

4. The method according to claim 1, which comprises surface-modifying the luminous substance pigments at elevated temperatures with alcohols, glycol ethers and silicones.

5. A method of producing a wavelength-converting casting composition for application on an ultraviolet, blue or green light emitting body, the wavelength-converting casting composition containing luminous substance pigments having grain sizes $\leq 20$ μm and a mean grain diameter $d_{50} \leq 5$ μm, the method which comprises:

providing a base of transparent epoxy casting resin;

providing the luminous substance pigments selected from the group consisting of Ce-doped phosphors; garnets doped with rare earths; thiogallates doped with rare earths;

aluminates doped with rare earths; and orthosilicates doped with rare earths;

mixing the luminous substance pigments with the base; and prior to the mixing step, adding hydrophobic silicone wax to the luminous substance pigments.

6. A method of producing a wavelength-converting casting composition for application on an ultraviolet, blue or green light emitting body, the wavelength-converting casting containing luminous substance pigments having grain sizes $\leqq 20$ μm and a mean grain diameter $d_{50} \leqq 5$ μm, the method comprising:
- providing a base of transparent epoxy casting resin;
- providing the luminous substance pigments selected from the group consisting of Ce-doped phosphors; garnets doped with rare earths; thiogallates doped with rare earths; aluminates doped with rare earths; and orthosilicates doped with rare earths;
- mixing the luminous substance pigments with the base; and
- surface-modifying the luminous substance pigments at elevated temperatures with alcohols, glycol ethers and silicones.

7. A method of producing a wavelength-converting casting composition for application on an ultraviolet, blue or green light emitting body component, the wavelength-converting casting composition containing luminous substance pigments having grain sizes $\leqq 20$ μm and a mean grain diameter $d_{50} \leqq 5$ μm, the method comprising:
- providing a base of transparent epoxy casting resin;
- providing the luminous substance pigments selected from the group consisting of Ce-doped phosphors; garnets doped with rare earths; thiogallates doped with rare earths; aluminates doped with rare earths; and orthosilicates doped with rare earths; and
- mixing the luminous substance pigments with the base, wherein the mean grain diameter $d_{50}$ of the luminous substance pigments is between one and two micrometers.

8. A method of producing a wavelength-converting casting composition for application on an ultraviolet, blue or green light emitting body, the wavelength-converting casting composition containing luminous substance pigments having grain sizes $\leqq 20$ μm and a mean grain diameter $d_{50} \leqq 5$ μm, the method comprising:
- providing a base of transparent epoxy casting resin;
- providing the luminous substance pigments selected from the group consisting of Ce-doped phosphors; garnets doped with rare earths; thiogallates doped with rare earths; aluminates doped with rare earths; and orthosilicates doped with rare earths;
- mixing the luminous substance pigments with the base; and
- adding light-scattering particles to the casting composition.

9. A method of producing a wavelength-converting casting composition for application on an ultraviolet, blue or green light emitting body, the wavelength-converting casting composition containing luminous substance pigments having grain sizes $\leqq 20$ μm and a mean grain diameter $d_{50} \leqq 5$ μm, the method comprising:
- providing a base of transparent epoxy casting resin;
- providing the luminous substance pigments selected from the group consisting of Ce-doped phosphors; garnets doped with rare earths; thiogallates doped with rare earths; aluminates doped with rare earths; and orthosilicates doped with rare earths; and
- mixing the luminous substance pigments with the base, wherein the casting composition comprises a content of iron $\leqq 20$ ppm.

10. A method of producing a wavelength-converting casting composition containing luminous substance pigments having grain sizes $\leqq 20$ μm and a mean grain diameter $d_{50} \leqq 5$ μm for a white light emitting semiconductor component having an electroluminescing semiconductor body emitting blue light, the method comprising:
- providing a base of transparent epoxy casting resin,
- providing the luminous substance pigments selected from the group consisting of garnets doped with rare earths; thiogallates doped with rare earths; aluminates dopes with rare earths; and orthosilicates doped with rare earths: which pigments shift some of the blue light emitted by the semiconductor body into the green and red spectral range;
- mixing the luminous substance pigments with the base; and
- prior to the mixing step, slurrying the luminous substance pigments in a high-boiling alcohol and subsequently drying the luminous substance pigments.

11. A method of producing a wavelength-converting casting composition containing luminous substance pigments having grain sizes $\leqq 20$ μm and a mean grain diameter $d_{50} \leqq 5$ μm for a white light emitting semiconductor component having an electroluminescing semiconductor body emitting blue light, the method comprising:
- providing a base of transparent epoxy casting resin,
- providing the luminous substance pigments selected from the group consisting of garnets doped with rare earths; thiogallates doped with rare earths; aluminates dopes with rare earths; and orthosilicates doped with rare earths: which pigments shift some of the blue light emitted by the semiconductor body into the green and red spectral range;
- mixing the luminous substance pigments with the base; and
- surface-modifying the luminous substance pigments at elevated temperatures with alcohols, glycol ethers and silicones.

12. A method of producing a wavelength-converting casting composition containing luminous substance pigments having grain sizes $\leqq 20$ μm and a mean grain diameter $d_{50} \leqq 5$ μm for a white light emitting semiconductor component having an electroluminescing semiconductor body emitting blue light, the method comprising:
- providing a base of transparent epoxy casting resin,
- providing the luminous substance pigments selected from the group consisting of garnets doped with rare earths; thiogallates doped with rare earths; aluminates dopes with rare earths; and orthosilicates doped with rare earths: which pigments shift some of the blue light emitted by the semiconductor body into the green and red spectral range;
- mixing the luminous substance pigments with the base; and
- prior to the mixing step, adding hydrophobic silicone wax to the luminous substance pigments.

13. A method of producing a wavelength converting casting composition containing luminous substance pigments having grain sizes $\leqq 20$ μm and a mean grain diameter $d_{50} \leqq 5$ μm for a white light emitting semiconductor component having an electroluminescing semiconductor body emitting blue light, the method comprising:
- providing a base of transparent epoxy casting resin,
- providing the luminous substance pigments selected from the group consisting of garnets doped with rare earths; thiogallates doped with rare earths; aluminates dopes with rare earths; and orthosilicates doped with rare earths: which pigments shift some of the blue light emitted by the semiconductor body into the green and red spectral range; and mixing the luminous substance pigments with the base; and wherein the casting composition comprises a content of iron $\leqq 20$ ppm.

14. The method according to claim 1, wherein the mean grain diameter $d_{50}$ of the luminous substance pigments is between one and two micrometers.

15. The method according to claim 1, which comprises adding light-scattering particles to the casting composition.

16. The method according to claim 1, wherein the casting composition comprises a content of iron $\leqq 20$ ppm.

17. The method according to claim 1, which further comprises, prior to the mixing step, tempering the luminous substance pigments at a temperature of $\geqq 200°$ C.

* * * * *

UNITED STATES PATENT AND TRADEMARK OFFICE
CERTIFICATE OF CORRECTION

PATENT NO. : 7,235,189 B2  Page 1 of 2
APPLICATION NO. : 09/731406
DATED : June 26, 2007
INVENTOR(S) : Klaus Höhn et al.

It is certified that error appears in the above-identified patent and that said Letters Patent is hereby corrected as shown below:

Title Page, Item (56) Page 5
Other Publications, left column, last reference in column, replace
"In the Matter of Certain Light-Emitting Diods ..." with
--In the Matter of Certain Light-Emitting Diodes ...--

Column 3
Line 27, replace "$d_{50} \leq 5$ μl" with --$d_{50} \leq 5$ μm--

Column 4
Line 30, replace "$(Y_3Al_5O_{12}:Ce^{3-})$" with --$(Y_3Al_5O_{12}:Ce^{3+})$--
Line 34, replace "$Y_3Ga_5O_{12}:Ce^{3-}$" with --$Y_3Ga_5O_{12}:Ce^{3+}$--
Lines 34-35, replace "$Y(Al, Ga)_5O_{12}:Ce^{3-}$" with --$Y(Al, Ga)_5O_{12}:Ce^{3+}$--
Line 35, replace "$Y(Al, Ga)_5O_{12}:Tb^{3-}$" with --$Y(Al, Ga)_5O_{12}:Tb^{3+}$--
Line 38, replace "$CaGa_2S_4:Ce^{3-}$ and $SrGa_2S_5:Ce^{3-}$" with
--$CaGa_2S_4:Ce^{3+}$ and $SrGa_2S_5:Ce^{3+}$--
Line 39, replace "$YAlO_3:Ce^{3-}$" with --$YAlO_3:Ce^{3+}$--
Line 40, replace "$YGaO_3:Ce^{3-}$, $Y(Al, Ga)O_3:Ce^{3-}$"
with --$YGaO_3:Ce^{3+}$, $Y(Al, Ga)O_3:Ce^{3+}$--
Line 41, replace "$M_2SiO_5:Ce^{3-}$" with --$M_2SiO_5:Ce^{3+}$--
Line 42, replace "$Y_2SiO_5:Ce^{3-}$" with --$Y_2SiO_5:Ce^{3+}$--

Column 6
Line 51, replace "$Y_3Al_5O_{12}Ce^{3-}$" with --$Y_3Al_5O_{12}Ce^{3+}$--
Line 57, replace "diffusers" with --diffusors--

Column 11
Lines 5 and 6, claim 6, insert --composition-- between the
words "wavelength-converting casting" and "containing luminous"

Signed and Sealed this

Eighteenth Day of May, 2010

David J. Kappos
*Director of the United States Patent and Trademark Office*

CERTIFICATE OF CORRECTION (continued)
U.S. Pat. No. 7,235,189 B2

Column 12
Line 5, claim 10, replace "electroluminescing" with --electroluminescent--
Line 10, claim 10, replace "aluminates dopes" with --aluminates doped--
Line 12, claim 10, replace "earths: which" with --earths; which--
Line 24, claim 11, replace "electroluminescing" with --electroluminescent--
Line 29, claim 11, replace "aluminates dopes" with --aluminates doped--
Line 31, claim 11, replace "earths: which" with --earths; which--
Line 43, claim 12, replace "electroluminescing" with --electroluminescent--
Line 48, claim 12, replace "aluminates dopes" with --aluminates doped--
Line 50, claim 12, replace "earths: which" with --earths; which--
Line 61, claim 13, replace "electroluminescing" with --electroluminescent--
Line 66, claim 13, replace "aluminates dopes" with --aluminates doped--

Column 13
Line 1, claim 13, replace "earths: which" with --earths; which--